(12) United States Patent
Xu et al.

(10) Patent No.: US 11,017,738 B2
(45) Date of Patent: May 25, 2021

(54) GATE DRIVING CIRCUIT

(71) Applicant: Century Technology (Shenzhen) Corporation Limited, Shenzhen (CN)

(72) Inventors: Qi Xu, Shenzhen (CN); Ming-Tsung Wang, New Taipei (TW); Wen-Lin Chen, New Taipei (TW); Jing Zhu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 129 days.

(21) Appl. No.: 16/201,931

(22) Filed: Nov. 27, 2018

(65) Prior Publication Data
US 2020/0013362 A1  Jan. 9, 2020

(30) Foreign Application Priority Data
Jul. 4, 2018  (CN) .......................... 201810725793.1

(51) Int. Cl.
*G09G 3/36*    (2006.01)
*H03K 17/687*  (2006.01)

(52) U.S. Cl.
CPC ....... *G09G 3/3677* (2013.01); *H03K 17/6871* (2013.01); *G09G 2310/06* (2013.01)

(58) Field of Classification Search
CPC .............. G09G 3/3677; G09G 3/3266; G09G 3/3674–3681; G09G 2310/06; G09G 2310/08; G09G 2310/0286; G09G 2330/021

See application file for complete search history.

(56) References Cited

U.S. PATENT DOCUMENTS

| 2016/0247442 | A1  | 8/2016  | Dai et al. |
| 2018/0082652 | A1  | 3/2018  | Lv et al. |
| 2018/0336957 | A1* | 11/2018 | Mi ...................... G11C 19/287 |
| 2019/0130859 | A1* | 5/2019  | Dai ...................... G11C 19/28 |

FOREIGN PATENT DOCUMENTS

| CN | 104505049 A | 4/2015 |
| CN | 108154856 A | 6/2018 |

* cited by examiner

*Primary Examiner* — William Boddie
*Assistant Examiner* — Jeffrey Parker
(74) *Attorney, Agent, or Firm* — ScienBiziP, P.C.

(57) ABSTRACT

A gate driving circuit which allows narrower framing of a display screen includes cascade-connected gate driving modules. Each gate driving module is electrically coupled to first and second scan lines and outputs scanning signals to the first and the second scan lines in a time-division manner in response to first and second clock signals. Each gate driving module includes an input transistor, and first and second output transistors. The input transistor receives a trigger signal for activating the gate driving module. The input transistor controls the first output transistor to output first scanning signal to first scan line in response to the first clock signal and controls the second output transistor to output second scanning signal to the second scan line in response to the second clock signal.

10 Claims, 5 Drawing Sheets

GATE DRIVING CIRCUIT

CROSS-REFERENCE TO RELATED APPLICATIONS

This application claims priority to Chinese Patent Application No. 201810725793.1 filed on Jul. 4, 2018, the contents of which are incorporated by reference herein.

FIELD

The subject matter herein generally relates to gate driving circuits.

BACKGROUND

In liquid crystal display technology, a display panel with a narrow bezel is desirable because the display panel with a narrow bezel is a selling point for attracting consumers. A gate on panel (GOP) technology is widely used in the display panel for achieving a narrow bezel. However, the display panel using the GOP technology cannot achieve a bezel of less than 1 millimeter (mm). As a number of pixels increases in the display panel, such a narrow bezel is hard to achieve.

Therefore, there is room for improvement in the art.

BRIEF DESCRIPTION OF THE FIGURES

Implementations of the present disclosure will now be described, by way embodiment, with reference to the attached figures.

DETAILED DESCRIPTION

Figure 1:
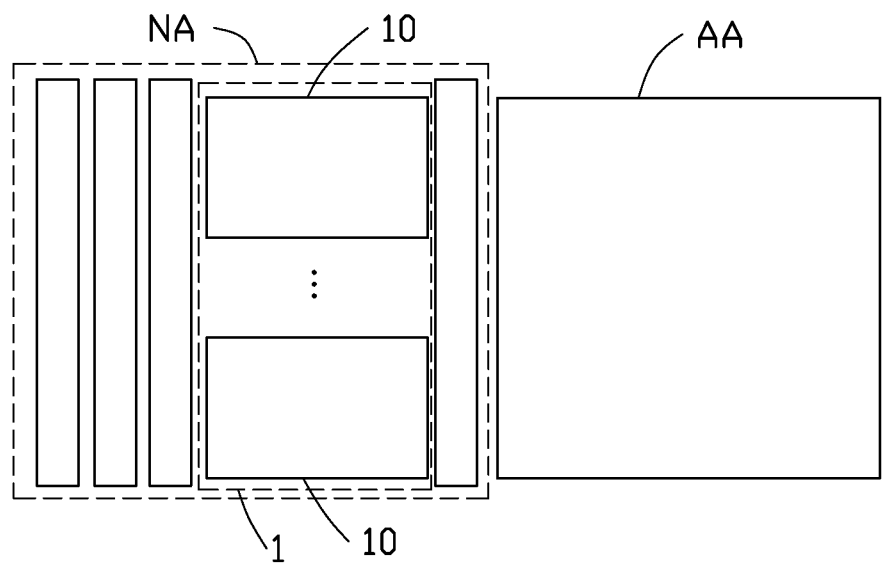
FIG. 1 is a diagrammatic view of an embodiment of a gate driving circuit in a display apparatus, the gate driving circuit includes several gate driving modules.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like. The term "circuit" is defined as an integrated circuit (IC) with a plurality of electronic elements, such as capacitors, resistors, and the like.

The present disclosure relates to a gate driving circuit with several gate driving modules embedded in a display apparatus. Each of the gate driving module is electrically connected to two scan lines, and drives the two connected scan lines in a time-division manner, thus a number of the gate driving modules is decreased. An area of the gate driving circuit is also decreased, and a width of a bezel of the display apparatus can also be reduced.

The gate driving circuit includes a plurality of cascade-connected gate driving modules. Each of the gate driving module is electrically coupled to a first scan line and a second scan line. Each of the gate driving module includes a first output transistor and a second output transistor.

The first output transistor includes a first control terminal coupled to a first node, a first input terminal receiving a first clock signal, and a first output terminal coupled to the first scan line; and The second output transistor includes a second control terminal coupled to the first node, a second input terminal receiving a second clock signal, and a second output terminal coupled to the second scan line. The first clock signal and the second clock signal are pulse signals with a specified frequency, and the second clock signal is simply the first clock signal shifted by a specified phase.

The first output terminal and the second output terminal output scanning signals to the first scan line and the second scan line respectively in a time-division manner.

First Embodiment

In the first embodiment of a display apparatus, a plurality of scan lines parallel with each other along a first direction and several data lines parallel with each other along a second direction. The first direction is perpendicular to the second direction. The gate driving circuit outputs scanning signals to the scan lines and scans pixels surrounded by the scan lines and the data lines.

Figure 2:
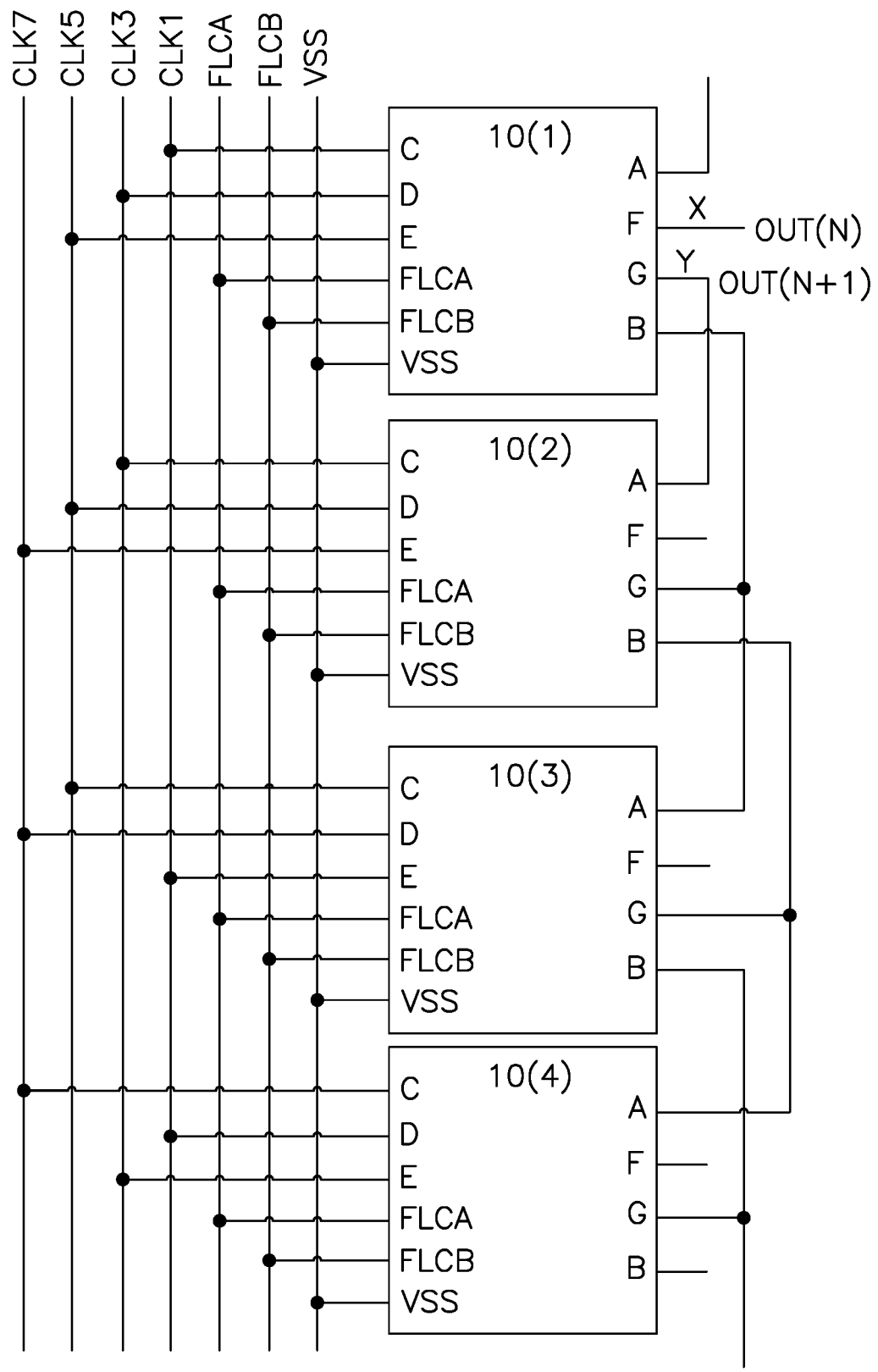
FIG. 2 is a diagrammatic view of the gate driving module of FIG. 1.

FIG. 1 shows an embodiment of the gate driving circuit 1 in the display apparatus. The display apparatus includes a display region AA and a non-display region NA surrounding the display region AA. The gate driving circuit 1 is arranged in the non-display region NA, and includes a plurality of cascade-connected gate driving modules 10. In one embodiment, each of the gate driving module 10 is driving two scan lines (e.g., a first scan line X and a second scan line Y as shown in FIG. 2) in a time-division manner, thereby reducing a number of the gate driving modules 10 and a number of connecting lines of the gate driving circuit 1. An area of the gate driving circuit 1 for achieving a narrow bezel design may be reduced.

FIG. 2 shows an embodiment of the gate driving modules 10 illustrating a connection manner and signals transmitting manner.

In one embodiment, there are four gate driving modules, 10(1)-10(4). The following description is related to the gate driving module 10(1). In one embodiment, the gate driving module 10(1) is electrically coupled to two adjacent scan lines, and outputs a first scanning signal OUT(N) to the first scan line X through a first output terminal F. A second scanning signal OUT(N+1) is output to the second scan line Y through a second output terminal G in a time-division manner. In other embodiments, at least one scan line is inserted between the scan lines connected to the gate driving module 10(1).

The gate driving module 10(1) receives a first clock signal through a first input terminal C, receives a second clock signal through a second input terminal D, and receives a third clock signal through a third input terminal E. The module 10(1) also receives the signal from the second output terminal G of an anterior gate driving module 10 (not shown) through a fourth input terminal A as a trigger signal. The signal from the second output terminal G of a following gate driving module 10(2) is received through a fifth input terminal B as a reset signal. In one embodiment, the first clock signal CLK1 serves as the first clock signal, the second clock signal CLK3 serves as the second clock signal, and the clock signal CLK5 serves as the third clock signal. The first clock signal CLK1 controls the signal of the first output terminal F of the gate driving module 10(1). When the trigger signal is effective (such as a high-level voltage), the signal outputted by the first output terminal F of the gate driving module 10(1) is synchronous with the first clock signal CLK1, until the reset signal is received. The second clock signal CLK3 controls the signal of the second output terminal G of the gate driving module 10(1). When the trigger signal is effective (such as a high-level voltage), the signal outputted by the second output terminal G of the gate driving module 10(1) is synchronous with the second clock signal CLK3, until the reset signal is received.

The first clock signal CLK1 shifted in a specified phase serves as the second clock signal CLK3. The first clock signal CLK1 and the second clock signal CLK3 are respectively effective in the time division manner, thus the first scanning signal of the first output terminal F and the second scanning signal of the second output terminal G in the gate driving module 10(1) are respectively outputted in the same time-division manner. When the reset signal is effective (such as a high-level voltage), the signals of the first output terminal F and the second output terminal G are ineffective (i.e. they may have a low-level voltage), for being reset. When the reset signal and the third clock signal CLK5 are effective, the third clock signal CLK5 clamps the signals of the first output terminal F and the second output terminal G at an ineffective, so avoiding being interrupted by other signals.

The first clock signal, the second clock signal, and the third clock signal of each of the gate driving module 10 can be different from each other. In one embodiment, the gate driving module 10(2) can use the clock signal CLK3 as the first clock signal, CLK5 as the second clock signal, and CLK7 as the third clock signal. The clock signal CLK3, the clock signal CLK5, and the clock signal CLK7 are each sequentially shifted by the specified phase. The first, the second, and the third clock signals of the following gate driving module 10(3) and the following gate driving module 10(4) are similar to those described above. Thus, the first and the second scanning signals outputted by the gate driving modules 10 are effective at different time periods.

Figure 3:
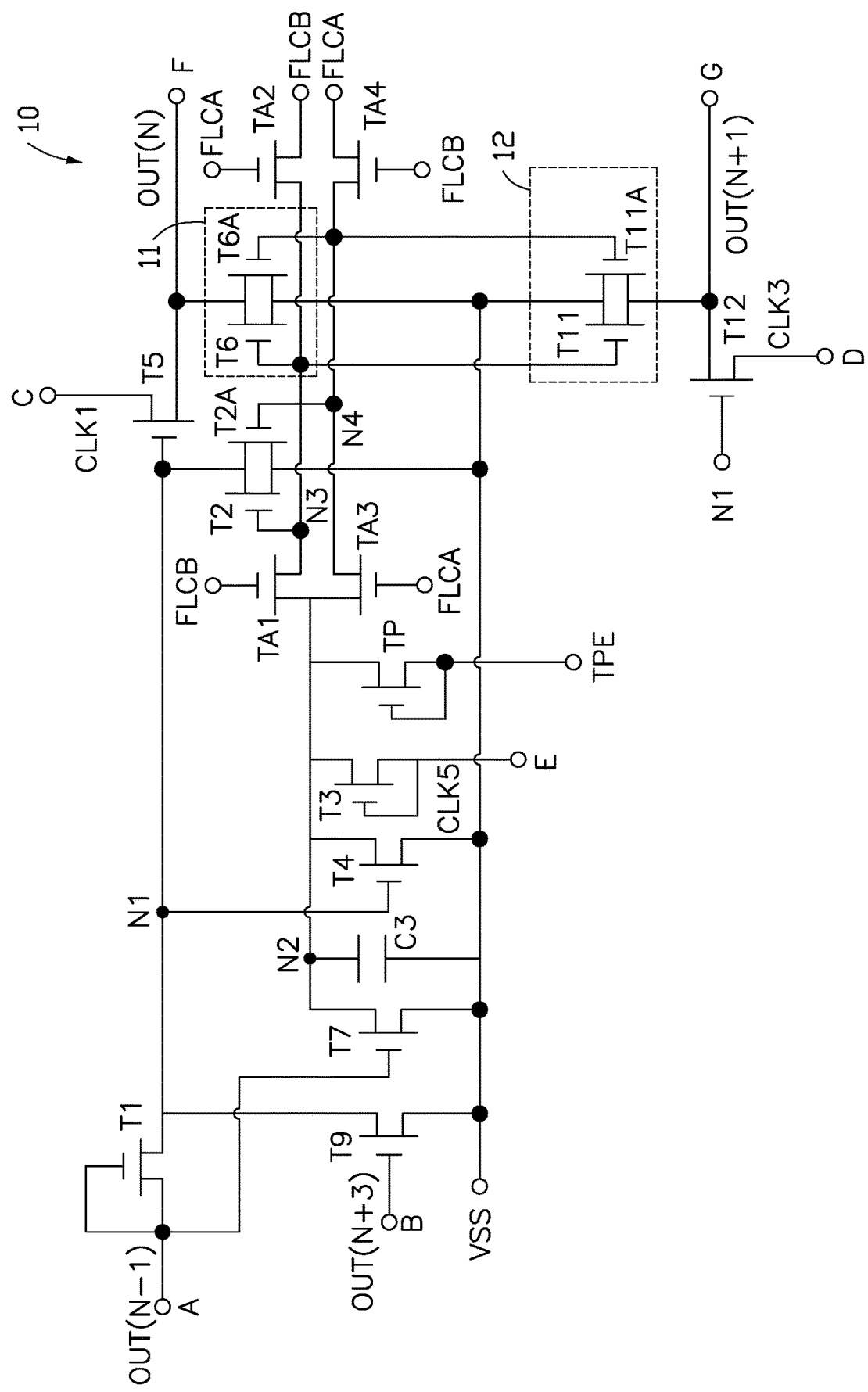
FIG. 3 is a circuit diagram view of the gate driving module of FIG. 2.

Each of the gate driving module 10 has a same electrical structure and includes the same terminals. The structure of the gate driving module 10 is described as an embodiment in FIG. 3 showing a detail circuit structure of the gate driving module 10.

In one embodiment, the gate driving module 10 is electrically coupled to the first scan line X and a second scan line Y, and outputs the first scanning signal OUT(N) to the first scan line X and the second scanning signal OUT(N+1) to the second scan line Y in a time-division manner.

The gate driving module 10 includes a first output transistor T5 and a second output transistor T12. The first output transistor T5 includes a first control terminal coupled to a first node N1, a first input terminal C receiving the first clock signal CLK1, and a first output terminal F coupled to the first scan line X. In one embodiment, the first control terminal is a gate electrode of the first output transistor T5, the first input terminal C is a source electrode of the first output transistor T5, and the first output terminal F is a drain electrode of the first output transistor T5.

Similarly, the second output terminal T12 includes a second control terminal coupled to a first node N1, a second input terminal D receiving the second clock signal CLK3, and a second output terminal G coupled to the second scan line Y. In one embodiment, the second control terminal is a gate electrode of the second output transistor T12, the second input terminal D is a source electrode of the second output transistor T12, and the second output terminal G is a drain electrode of the second output transistor T12.

The gate driving module 10 further includes an input transistor T1 and a reset transistor T9. A gate electrode and a source electrode of the input transistor T1 both are electrically coupled to the fourth input terminal A, and receive the trigger signal. A drain electrode of the input transistor T1 is electrically connected to a low power terminal VSS. A gate electrode of the reset transistor T9 is electrically coupled to the fifth input terminal B, a source electrode of the reset transistor T9 is electrically coupled to the source electrode of the input transistor T1, and a drain electrode of the reset transistor T9 is electrically connected to the low power terminal VSS. The fifth input terminal B receives the reset signal. The first output terminal F and the second output terminal G are ineffective when the reset signal is effective.

When the trigger signal is effective, the input transistor T1, the first output transistor T5, and the second output transistor T12 are turned on, and the first clock signal CLK1 is inputted to the first output transistor T5 through the first input terminal C. The signal of the first output terminal F is synchronous with the first clock signal CLK1, and the signal of the second output terminal G is synchronous with the second clock signal CLK3. The first clock signal and the second clock signal CLK3 are sequentially shifted by the specified phase, thus the signal of the first output terminal F and the second output terminal G are effective in a time-division manner.

The gate driving module 10 further includes a first clamping unit 11 and a second clamping unit 12. The first clamping unit 11 includes a first clamping transistor T6 and a second clamping transistor T6A. The second clamping unit 12 includes a third clamping transistor T11 and a fourth clamping transistor T11A.

A drain electrode of the first clamping transistor T6 is electrically coupled to a drain electrode of the second clamping transistor T6A, and a source electrode of the first clamping transistor T6 is electrically coupled to a source electrode of the second clamping transistor T6A. Further, the first clamping transistor T6 is electrically coupled to the first output terminal F. Similarly, a drain electrode of the third clamping transistor T11 is electrically coupled to a drain electrode of the fourth clamping transistor T11A, and a source electrode of the third clamping transistor T11 is electrically coupled to a source electrode of the fourth clamping transistor T11A. Further, the third clamping transistor T11 is electrically coupled to the second output terminal G. Gate electrodes of the first clamping transistor T6 and the second clamping transistor T6A are electrically coupled to a second node N3. Gate electrodes of the third clamping transistor T11 and the fourth clamping transistor T11A are electrically coupled to a third node N4.

When the first scanning signal OUT(N) and the second scanning signal OUT(N+1) are at low-level voltage based on the reset signal, the first clamping unit 11 and the second clamping unit 12 clamp the first scanning signal OUT(N) and the second scanning signal OUT(N+1) at low-level voltage.

The gate driving module 10 further includes a first control transistor TA2, a second control transistor TA4, a third control transistor TA1, a fourth control transistor TA3, a fifth control transistor T3, a fifth clamping transistor T2, a sixth clamping transistor T2A, a first transistor T7, a second transistor T4, and a third transistor Tp. The first control transistor TA2, the second control transistor TA4, the third control transistor TA1, and the fourth control transistor TA3 control the first clamping unit 11 and the second clamping unit 12 to clamp the first output terminal F and the second output terminal G to the low-level voltage, in response to the first control signal FLCB and the second control signal FLCA. The fifth clamping transistor T2 and the sixth clamping transistor T2A clamp the first node N1 to the low-level voltage in response to the first control signal FLCB and the second control signal FLCA.

A gate electrode of the first transistor T7 is electrically coupled to the fourth input terminal A, and a source electrode of the first transistor T7 is electrically coupled to the fourth node N2. A gate electrode of the second transistor T4 is electrically coupled to the first node N1, and a source electrode of the second transistor T4 is electrically coupled to the fourth node N2. Drain electrodes of the first transistor T7 and the second transistor T4 are electrically connected to the low power terminal VSS. A gate electrode of the fifth control transistor T3 is electrically coupled to a drain electrode of the fifth control transistor T3, and is further electrically coupled to the third input terminal E. The fifth control transistor T3 receives the third clock signal CLK5 from the third input terminal E. A source electrode of the fifth control transistor T3 is electrically coupled to the fourth node N2. A source electrode of the third transistor Tp is electrically coupled to the fourth node N2. A gate electrode of the third transistor Tp is electrically coupled to a drain electrode of the third transistor Tp, and is further electrically coupled to a common node (such as a terminal TPE shown in FIG. 3). The terminal TPE remains at the low-level voltage. Source electrodes of the fifth clamping transistor T2 and the sixth clamping transistor T2A are electrically coupled to the first node N1. Drain electrode of the fifth clamping transistor T2 and the sixth clamping transistor T2A are grounded. A gate electrode of fifth clamping transistor T2 is electrically coupled to the second node N3. A gate electrode of the sixth clamping transistor T2A is electrically coupled to the third node N4.

A gate electrode of the third control transistor TA1 receives a first control signal FLCB, a source electrode of the third control transistor TA1 is electrically coupled to the fourth node N2, and a drain electrode of the third control transistor TA1 is electrically coupled to the second node N3. A gate electrode of the fourth control transistor TA3 receives a second control signal FLCA, a source electrode of the fourth control transistor TA3 is electrically coupled to the fourth node N2, and a drain electrode of the fourth control transistor TA3 is electrically coupled to the third node N4. A gate electrode of the first control transistor TA2 receives the second control signal FLCA, a source electrode of the first control transistor TA2 receives the first control signal FLCB, and a drain electrode of the first control transistor TA2 is electrically coupled to the second node N3. A gate electrode of the second control transistor TA4 receives the first control signal FLCB, a source electrode of the second control transistor TA4 receives the second control signal FLCB, and a drain electrode of the second control transistor TA4 is electrically coupled to the third node N4.

The first control signal FLCB and the second control signal FLCA are pulse signal of same specified amplitude. At same point in time, the voltage level of the first control signal FLCB is opposite to the voltage level of the second control signal FLCA. Either the first control signal FLCB or the second control signal FLCA is at the high level voltage; the other one is at the low level voltage. The first clamping unit 11 and the second clamping unit 12 clamp the first scanning signal OUT(N) and the second scanning signal OUT(N+1) at low-level voltage based on the first control signal FLCB and the second control signal FLCA.

Figure 4:
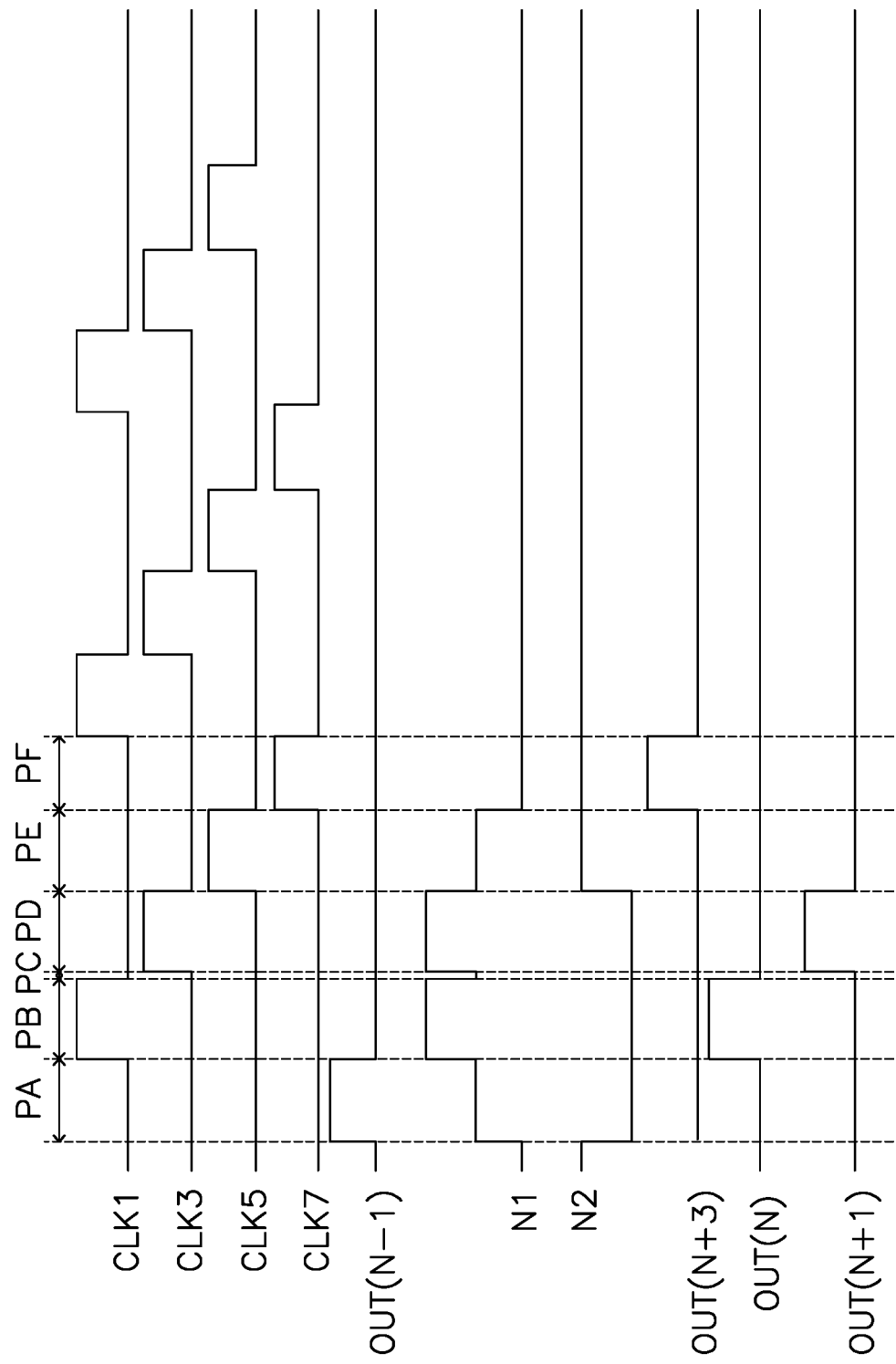
FIG. 4 is a timing chart showing waveforms of the gate driving module of FIG. 2.

FIG. 4 shows a timing chart of waveforms of the gate driving module 10(1). The operation of the gate driving module 10(1) is that, in one frame, the gate driving module 10(1) sequentially operates under a first time period PA, a second time period PB, a third time period PC, a fourth time period PD, a fifth time period PE, and a sixth time period PF.

When operating under the first time period PA, the trigger signal of the gate driving module 10(1) is at high-level voltage, the input transistor T1 turns on, and the voltage of the first node N1 is pulled up to the high-level voltage. OUT(N−1) (see FIG. 4) represents the second scanning signal from the anterior gate driving module 10 as the trigger signal of the gate driving module 10(1). The first output transistor T5 turns on based on the high-level voltage at the first node N1, thus the first scanning signal OUT(N) is synchronous with the first clock signal CLK1 at the low-level voltage, and the second scanning signal OUT(N+1) is synchronous with the second clock signal CLK3 at the low-level voltage. The sixteenth transistor T17 turns on, thus the signal of the fourth node N2 is pulled down to the low-level voltage. Thus, the first clamping unit 11 and the second clamping unit 12 stop working.

When operating under the second time period PB, the first clock signal CLK1 is at the high-level voltage, the voltage of the first node N1 is increased, and the first scanning signal OUT(N) is at the high-level voltage in response to the first clock signal CLK1. The second scanning signal OUT(N+1) is at the low-level voltage in response to the second clock signal CLK3.

When operating under the third time period PC, the first clock signal CLK1 is at the low-level voltage, the voltage of the first node N1 is decreased to be equal to the voltage of the first node N1 at the first time period A, and the first scanning signal OUT(N) is at the low-level voltage in response to the first clock signal CLK1. The second clock signal CLK3 is at the low-level voltage. The second scanning signal OUT(N+1) is at the low-level voltage in response to the second clock signal CLK3.

When operating under the fourth time period PD, the first clock signal CLK1 is at the low-level voltage, the voltage of the first node N1 is increased to be equal to the voltage of the first node N1 at the second time period B, and the first scanning signal OUT(N) is at the low-level voltage in response to the first clock signal CLK1. The second clock signal CLK3 is at the high-level voltage. The second scanning signal OUT(N+1) is at the high-level voltage in response to the second clock signal CLK3.

When operating under the fifth time period PE, the third clock signal CLK5 is at the low-level voltage, and the first node N1 is at the high-level voltage in the first time period PA. The first clock signal CLK1 is at the low-level voltage. The first scanning signal OUT(N) is at the low-level voltage in response to the first clock signal CLK1. The second clock signal CLK3 is at the low-level voltage. The second scanning signal OUT(N+1) is at the low-level voltage in response to the second clock signal CLK3.

When operating under the sixth time period PF, the reset signal OUT(N+3) is at the high-level voltage, and the reset transistor T9 turns on. The voltage of the first node N1 is decreased to the low-level voltage in response to the reset transistor T9 being turned on. The third clock signal CLK5 is at the high-level voltage, thus the fifth control transistor T3 turns on. The voltage of the fourth node N2 is increased in response to the turned on fifth control transistor T3. The third control transistor TA1 and the fourth control transistor TA3 alternately turn on in response to the first control signal FLCB and the second control signal FLCA. The fifth clamping transistor T2 and the sixth clamping transistor T2 alternately turn on in response to the first control signal FLCB and the second control signal FLCA. The voltage of the first node N1 is at the low-level voltage. The first clamping unit 11 and the second clamping unit 12 respectively clamp the voltages of the first output terminal F and the second output terminal G at the low-level voltage, and the first scanning signal OUT(N) and the second scanning signal OUT(N+1) are at low-level voltage.

In one embodiment, in one frame, the first control signal FLCB is at the low-level voltage, and the second control signal FLCA is at the high-level voltage. In other embodiments, in one frame, the first control signal FLCB is at the high-level voltage, and the second control signal FLCA is at the low-level voltage. The first control signal FLCB and the second control signal FLCA are inverted in a specified time period.

Figure 5:
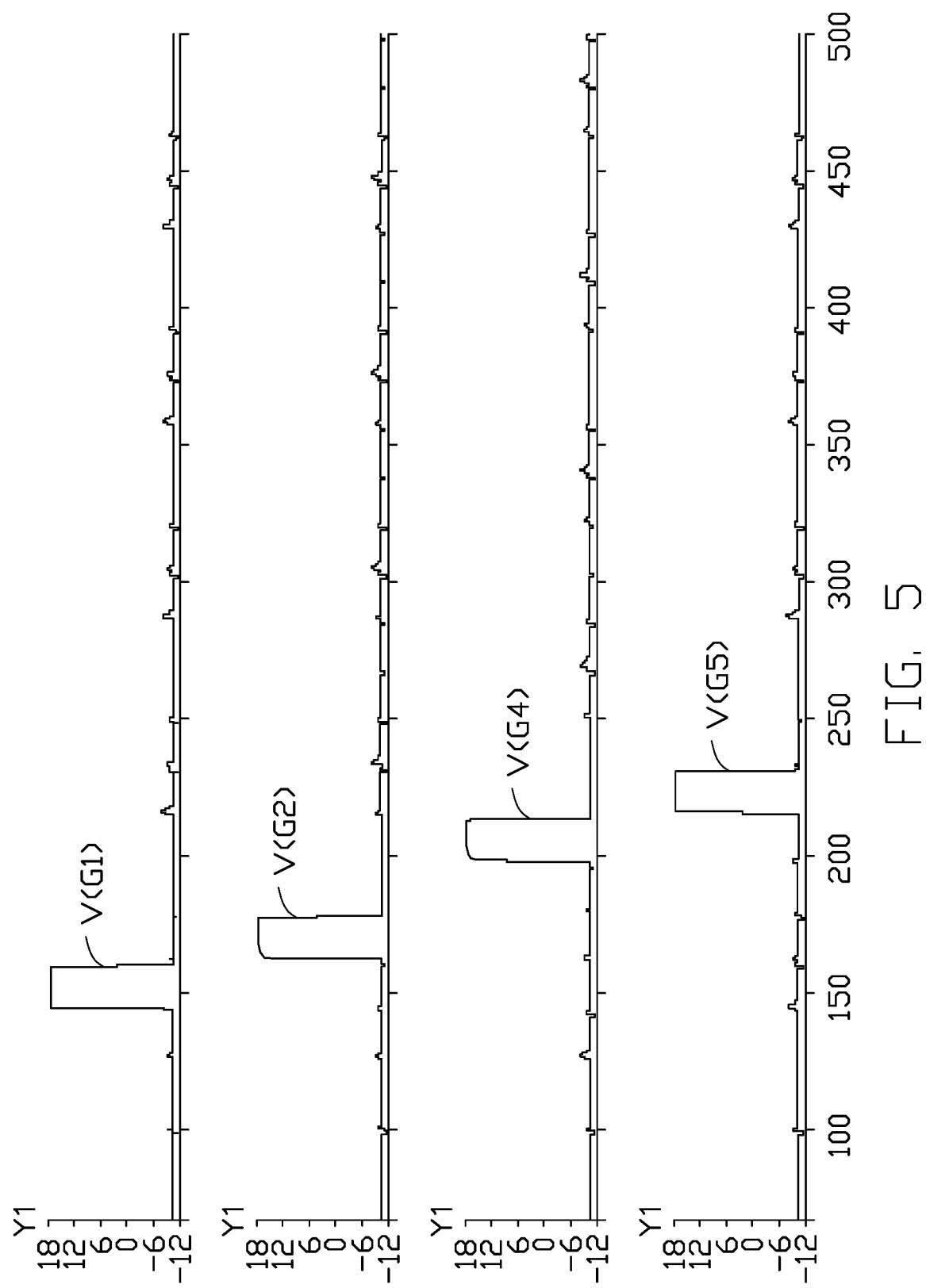
FIG. 5 is a timing chart showing waveforms of the signals outputted by two of the gate driving modules of FIG. 2 in a simulation software.

In this structure of the gate driving module 10, each of the gate driving module 10 outputs two scanning signals in a time-division manner. FIG. 5 shows the waveforms of the scanning signals outputted by two gate driving modules 10 of the gate driving circuit 1. V(G1) represents the first scanning signal of the gate driving module 10(1). V(G2) represents the second scanning signal of the gate driving module 10(1). V(G4) represents the first scanning signal of the gate driving module 10(2). V(G5) represents the second scanning signal of the gate driving module 10(2). The signals outputted by the gate driving circuit 1 are sequentially outputted to the scan lines.

In one embodiment, each gate driving module 10 in same circuit structure drives two adjacent scan lines in a time-division manner.

Second Embodiment

Each gate driving module 10 in same circuit structure drives two scan lines in a time-division manner. In one embodiment, in the display apparatus, the number of the scan lines is 1028. The scan lines are divided into a first group and a second group. In the first group, the number of the scan lines is 514, and the scan lines are sequentially labeled from 1 to 514. In the second group, the number of the scan lines is 514, and the scan lines are sequentially labeled from 515 to 1028. Each gate driving module 10 is electrically coupled to the scan line in the first group and the scan line in the second group. After all of the gate driving modules 10 generate the first scanning signal, the first gate driving module 10 starts to generate the second scanning signal.

In this structure of the gate driving circuit, each gate driving module outputs two scanning signals to two scan lines in a time-division manner, thus a number of the gate driving modules is reduced. Further, the area of the gate driving circuit in the non-display region is also reduced, and a required width of the bezel in the display apparatus is reduced.

Also, based on the reduced area of the gate driving circuit, the area of the display region is increased. A distance between two elements in the display region is increased, improving ESD effect, and there is room for improving widths and length of ESD discharging paths.

Also, design potential of such gate driving module is also improved. A distance between adjacent metal elements is related to an aperture ratio of glue for sealing the gate driving module. The design of the gate driving circuit as disclosed improves the aperture ratio, reducing a risk of contamination of the liquid crystals in the display apparatus.

While various exemplary and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A gate driving circuit comprising:
   a plurality of cascade-connected gate driving modules, each gate driving module is electrically coupled to a first scan line and a second scan line, each gate driving module comprising:
   an input transistor configured to receive a trigger signal for activating the gate driving module;
   a first output transistor with a first control terminal coupled to the input transistor through a first node, a first input terminal receiving a first clock signal, and a first output terminal coupled to the first scan line; and
   a second output transistor with a second control terminal coupled to the first node, a second input terminal receiving a second clock signal, and a second output terminal coupled to the second scan line;
   wherein the first clock signal and the second clock signal are pulse signals with a specified frequency, and the first clock signal is shifted by a specified phase to serve as the second clock signal;
   wherein the first output terminal and the second output terminal output scanning signals to the first scan line and the second scan line respectively in a time-division manner in response to the first clock signal and the second clock signal;
   the gate driving module further comprises a first clamping unit; the first clamping unit is electrically coupled to the first output terminal, and clamps the first output terminal at a low-level voltage based on a first control signal and a second control signal; the first control signal and the second control signal are alternately at high-level voltage and inverted in a specified time period; when the gate driving module receives a reset signal, the first clamping unit clamps the first output terminal at the low-level voltage based on the first control signal and the second control signal;
   wherein the first clamping unit comprises a first clamping transistor and a second clamping transistor; a gate electrode of the first clamping transistor is electrically coupled to a drain electrode of a first control transistor through a second node, a gate electrode of the second clamping transistor is electrically coupled to a drain electrode of a second control transistor through a third node, source electrodes of the first clamping transistor and the second clamping transistor are electrically coupled to the first output terminal, and drain electrodes of the first clamping transistor and the second clamping transistor are grounded; a gate electrode of the first control transistor and a source electrode of the fourth control transistor receive the second control signal, a source electrode of the first control transistor and a gate electrode of the second control transistor receive the first control signal.

2. The gate driving circuit of claim 1, wherein the gate driving module further comprises a second clamping unit; the second clamping unit clamps the second output terminal at a low-level voltage based on the first control signal and the second control signal.

3. The gate driving circuit of claim 2, wherein the second clamping unit comprises a third clamping transistor and a fourth clamping transistor; a gate electrode of the third clamping transistor is electrically coupled to the second node, a gate electrode of the fourth clamping transistor is electrically coupled to the third node, source electrodes of the third clamping transistor and the fourth clamping transistor are electrically coupled to the second output terminal, and drain electrodes of the third clamping transistor and the fourth clamping transistor are grounded.

4. The gate driving circuit of claim 1, wherein the gate driving module further comprises a third control transistor, a fourth control transistor, and a fifth control transistor; a gate electrode of the third control transistor receives the first control signal, a source electrode of the third control transistor is electrically coupled to a source electrode of the fifth control transistor through a fourth node, and a drain electrode of the third control transistor is electrically coupled to the second node; a gate electrode of the fourth control transistor receives the second control signal, a source electrode of the fourth control transistor is electrically coupled to the fourth node, and a drain electrode of the third control transistor is electrically coupled to the third node; a gate electrode and a drain electrode of the fifth control transistor receive a third clock signal.

5. The gate driving circuit of claim 1, wherein the gate driving module further comprises a fifth clamping transistor and a sixth clamping transistor; the fifth clamping transistor and the sixth clamping transistor clamp the first node to the low-level voltage based on the first control signal and the second control signal; a gate electrode of the fifth clamping transistor is electrically coupled to the second node, a gate electrode of the sixth clamping transistor is electrically coupled to the third node, source electrodes of the fifth clamping transistor and the sixth clamping transistor are electrically coupled to the gate electrode of the first output terminal, and drain electrodes of the fifth clamping transistor and the sixth clamping transistor are grounded.

6. The gate driving circuit of claim 1, wherein the gate driving module further comprises a reset transistor; a gate electrode of the reset transistor receives a reset signal for resetting the gate driving module, a source electrode of the reset transistor is electrically coupled to the first node, and a drain electrode of the reset transistor is grounded.

7. The gate driving circuit of claim 1, wherein the gate driving module further comprises a first transistor; a gate electrode of the first transistor receives the trigger signal, and a source electrode of the first transistor is electrically coupled to the fourth node, and a drain electrode of the first transistor is grounded.

8. The gate driving circuit of claim 1, wherein the gate driving module further comprises a second transistor; a gate electrode of the second transistor is electrically coupled to the first node, and a source electrode of the second transistor is electrically coupled to the fourth node, and a drain electrode of the second transistor is grounded.

9. The gate driving circuit of claim 1, wherein the gate driving module further comprises a third transistor; a gate electrode and a drain electrode of the third transistor is electrically coupled to a terminal, and a source electrode of the second transistor is electrically coupled to the fourth node; the signal of the terminal remains at the low-level voltage.

10. The gate driving circuit of claim 1, wherein the first scan line and the second scan line are two adjacent scan lines.

* * * * *